United States Patent
Han et al.

(10) Patent No.: US 11,003,536 B2
(45) Date of Patent: May 11, 2021

(54) METHOD, DEVICE AND COMPUTER READABLE STORAGE MEDIUM FOR WRITING TO DISK ARRAY

(71) Applicant: EMC IP Holding Company LLC, Hopkinton, MA (US)

(72) Inventors: Geng Han, Beijing (CN); Jian Gao, Beijing (CN); Lifeng Yang, Beijing (CN); Jibing Dong, Beijing (CN); Xinlei Xu, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 121 days.

(21) Appl. No.: 16/275,562

(22) Filed: Feb. 14, 2019

(65) Prior Publication Data
US 2019/0332477 A1 Oct. 31, 2019

(30) Foreign Application Priority Data
Apr. 28, 2018 (CN) .......................... 201810400267.8

(51) Int. Cl.
  *G06F 11/10* (2006.01)
  *G11C 29/52* (2006.01)
  *G06F 3/06* (2006.01)
(52) U.S. Cl.
  CPC ........ *G06F 11/1088* (2013.01); *G06F 3/0619* (2013.01); *G06F 3/0644* (2013.01); *G06F 3/0659* (2013.01); *G06F 3/0689* (2013.01); *G11C 29/52* (2013.01)

(58) Field of Classification Search
  CPC ............ G06F 11/1088; G06F 11/1092; G06F 11/1096; G06F 11/1451; G06F 11/1456; G06F 3/0689; G06F 3/0688; G06F 3/065; G06F 3/0659
  See application file for complete search history.

(56) References Cited

U.S. PATENT DOCUMENTS

| | | | |
|---|---|---|---|
| 7,246,211 B1 * | 7/2007 | Beloussov | G06F 11/1461 707/999.2 |
| 7,647,526 B1 * | 1/2010 | Taylor | G06F 11/1092 714/6.32 |
| 8,074,019 B2 * | 12/2011 | Gupta | G06F 11/1435 711/114 |
| 9,081,752 B2 | 7/2015 | Aliev et al. | |
| 9,507,535 B2 | 11/2016 | Aliev et al. | |
| 9,804,939 B1 | 10/2017 | Bono et al. | |
| 10,210,045 B1 | 2/2019 | Gao et al. | |
| 10,210,063 B2 * | 2/2019 | Agombar | G06F 3/0689 |
| 10,289,336 B1 | 5/2019 | Liu et al. | |

(Continued)

*Primary Examiner* — Nadeem Iqbal
(74) *Attorney, Agent, or Firm* — BainwoodHuang

(57) ABSTRACT

Techniques involve writing to a disk array. In response to a request for writing target data to a target storage area in a stripe of the disk array including at least one failed storage area, it is determined whether incompletion of the writing of the target data is to cause failed data in the at least one failed storage area to be unrecoverable. In response to determining that the incompletion of the writing is to cause failed data to be unrecoverable, the failed data is recovered. The recovered data is stored in a persistent memory, and the target data is written in the target storage area. In this way, the efficiency and performance of writing processing of the disk array having a failed disk is increased significantly.

20 Claims, 6 Drawing Sheets

(56) References Cited

U.S. PATENT DOCUMENTS

| | | |
|---|---|---|
| 10,372,384 B2 | 8/2019 | Liu et al. |
| 10,459,814 B2 | 10/2019 | Gao et al. |
| 10,496,483 B2 | 12/2019 | Xiao et al. |
| 10,552,078 B2 | 2/2020 | Gong et al. |
| 10,747,460 B2 | 8/2020 | Sun et al. |
| 10,824,361 B2 | 11/2020 | Sun et al. |
| 2009/0327803 A1* | 12/2009 | Fukutomi ............ G06F 11/108 714/6.32 |
| 2014/0245062 A1* | 8/2014 | Cooper ............... G06F 11/1092 714/6.22 |
| 2018/0095676 A1* | 4/2018 | Zhao ................... G06F 11/1076 |
| 2018/0225184 A1* | 8/2018 | Agombar ................ G06F 3/064 |

* cited by examiner

METHOD, DEVICE AND COMPUTER READABLE STORAGE MEDIUM FOR WRITING TO DISK ARRAY

FIELD

Embodiments of the present disclosure generally relate to the field of computer technology, and more specifically, to a method, a device and a computer readable storage medium for writing to a disk array.

BACKGROUND

Redundant array of independent disks (RAID) generally includes a data disk and a parity disk. The parity disk is used for storing parity data of valid data, for example, parity check information, in the data disk. RAID may be divided into multiple stripes across disks. Each stripe includes a plurality of data storage areas located on multiple data disks and a parity storage area located on the parity disk. The parity storage area stores parity data of valid data in the data storage area of a same stripe. When a certain disk fails, failed data stored on the failed disk in the stripe can be recovered based on the parity data in the parity storage area.

After a disk fails, RAID enters a degraded mode under which the RAID can still process read and write input/output (IO) request for other disks. When the degraded RAID processes a write IO for a certain disk, if a power failure occurs, it may cause the write operation on the disk to be incomplete. Thus, data on the disk is still an old version while data on the parity disk has been updated to a new version. An inconsistency of version as such would render the data on the failed disk in the RAID unrecoverable, which causes a "write hole".

A problem of the "write hole" is a common problem in RAID. A traditional solution is to reserve some space at the end of each disk as a journal area. When the degraded RAID processes a write IO request, data to be written may be stored temporarily in the journal area. If the above incompletion of the write operation occurs when data is updated, the data in the journal area is used to restore consistency of the RAID stripe after system recovery, thereby avoiding a risk of data loss on a failed disk.

However, this approach introduces extra operations of data write/read and thus reducing performance of write IO.

SUMMARY

In general, embodiments of the present disclosure provide a method, device and computer readable storage medium for writing to disk array.

In a first aspect, embodiments of the present disclosure provide a method of writing to a disk array. In this method, in response to a request for writing target data to a target storage area in a stripe of the disk array including at least one failed storage area, it is determined whether incompletion of the writing of the target data is to cause failed data in the at least one failed storage area to be unrecoverable. If it is determined that the incompletion of the writing is to cause the failed data to be unrecoverable, the failed data is recovered. The recovered data is stored in a persistent memory, and the target data is written in the target storage area.

In a second aspect, embodiments of the present disclosure provide a device for writing to a disk array. The device includes a processor and a memory storing computer executable instructions which, when executed by the processor, cause the device to perform acts. The acts include: in response to a request for writing target data to a target storage area in a stripe of the disk array including at least one failed storage area, determining whether the incompletion of the writing of the target data is to cause failed data in the at least one failed storage area to be unrecoverable; in response to determining that the incompletion of the writing is to cause failed data to be unrecoverable, recovering the failed data; storing recovered data in a persistent memory; and writing the target data in the target storage area.

In a third aspect, embodiments of the present disclosure provide a computer readable storage medium storing computer executable instructions thereon which, when executed in the processor, cause the processor to implement the method according to the first aspect.

It is to be understood that the content described in the Summary is not intended to identify key features or essential features of the claimed subject matter, nor is it intended to be used to limit the scope of the claimed subject matter. Other features of the present disclosure will be more comprehensible with the following depiction.

BRIEF DESCRIPTION OF THE DRAWINGS

Through the following detailed description with reference to the accompanying drawings, the above and other features, advantages and aspects of embodiments of the present disclosure will become more apparent. In the drawings, the same or similar reference symbols refer to the same or similar elements, in which.

DETAILED DESCRIPTION OF EMBODIMENTS

Figure 1A:
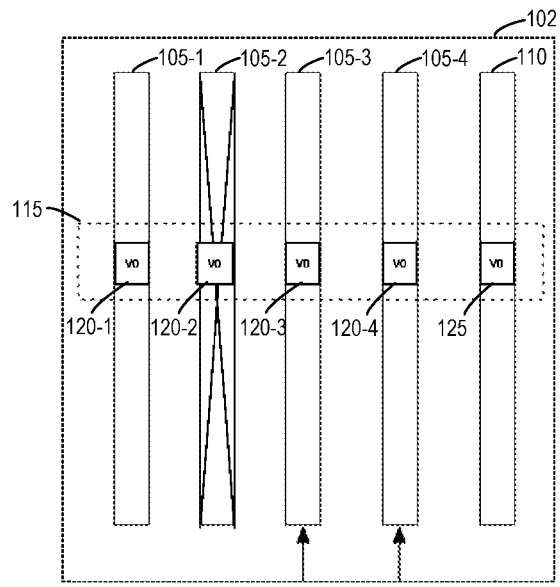
FIG. 1(a) illustrates an example state of a disk array when a write operation is not performed.

Embodiments of the present disclosure will be described in the following in more details with reference to the drawings. Although some embodiments of the present disclosure are displayed in the drawings, it is to be understood that the present disclosure may be implemented in various manners and should not be limited to the embodiments illustrated herein. On the contrary, these embodiments are provided to make the present disclosure more thorough and complete. It is to be understood that the drawings of the present disclosure and embodiments thereof are only for the purpose of illustration, without the limitation to the scope of protection of the present disclosure.

As used herein, the term "disk array" refers to a logic disk group formed by a plurality of physical disks in any proper manner. Examples of disk arrays include different levels of RAID, such as RAID 5 and RAID 6.

As used herein, the term "valid data" refers to data stored on a data disk in a disk array. The term "parity data" used herein refers to data used for verifying valid data in the disk array which is stored in a parity disk of a disk array.

As used herein, the term "includes" and its variants are to be read as open-ended terms that mean "includes, but is not limited to." The term "based on" is to be read as "based at least in part on." The term "one embodiment" is to be read as "at least one embodiment"; the term "another embodiment" is to be read as "at least one another embodiment." The following text will give relevant definitions of other terms.

As stated above, when a certain disk in a RAID fails, the RAID will enter a degraded mode. When the degraded RAID processes a write request to the disk, disk write might be incomplete because of a power failure. If the incomplete write causes an inconsistency of a corresponding stripe in the RAID, failed data in the failed disk would be impossible to be recovered, thus causing the problem of "write hole".

Figure 1B:
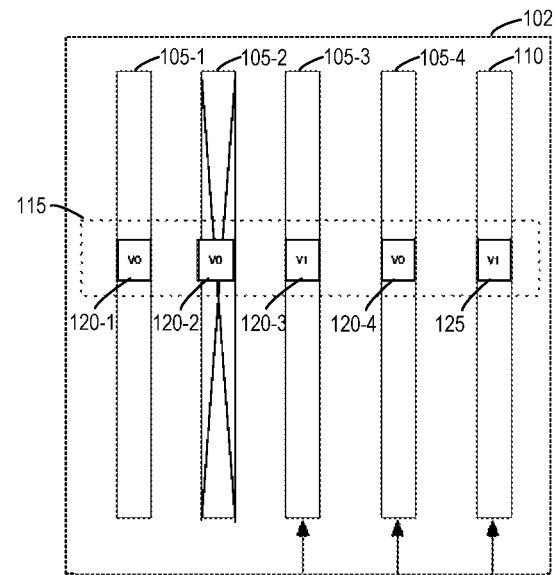
FIG. 1(b) illustrates an example state of a disk array after a write operation is performed.

An operation of performing a write IO in degraded mode when a disk in the disk array fails will be described below with reference to FIGS. 1(a) and 1(b). FIG. 1(a) illustrates an example state of the disk array when a write operation is not performed and FIG. 1(b) illustrates an example state of the disk array after the write operation is performed.

As shown, there are four data disks 105-1 to 105-4 and a parity disk 110 in a disk array 102. In the disk array 102, a stripe 115 is divided across data disks 105-1 to 105-4 and the parity disk 110. The stripe 115 includes four data storage areas 120-1 to 120-4 on data disks 105-1 to 105-4 and a parity storage area 125 on the parity disk 110.

In the disk array 102, data disk 105-2 fails and thus, the disk array 102 operates in a degraded mode. Then, a write IO to write new data to data disks 105-3 and 150-4 is received. Before the write IO is executed, as shown in FIG. 1(a), all the storage areas 120-1 to 120-4 and 120-5 store an old version (represented as "V0") of data.

When the write IO is executed, the following operations may be performed based on a RAID algorithm:

1. Read old valid data from the data disks 105-3 and 105-4 and read old parity data from the parity disk 110.
2. Remove old valid data in the data disks 105-3 and 105-4 from the old parity data through the XOR-out operation.
3. Add new valid data to be written into the parity data through the XOR-in operation so as to generate new parity data.
4. Write new valid data to data disks 105-3 and 105-4 and write the new parity data to the parity disk 110.

At step 4, the new valid data and the parity data should be updated to the corresponding disk. However, if a power failure occurs when this step is implemented, it may still cause the write on the data disk 105-4 to be incomplete. In this case, as shown in FIG. 1(b), data on the disk is still an old version of data while data on the data disk 105-3 and the parity disk 110 is a new version (represented as "V1") of data. As a result, versions of data in the corresponding storage areas in the stripe 115 are inconsistent.

Traditionally, 8 bytes may be reserved at the end of each sector of each disk for storing extra metadata recording information about a data version. With such information, it can be determined whether the above inconsistency exists in the corresponding stripe.

In some conditions, this kind of inconsistency may be repaired. For example, if an original write comes from a cache, then data to be written is still possibly kept in the cache. Besides, a user may also keep data to be written. As such, the data disk 105-4 is updated with the new version of data through data rewrite thus repairing the inconsistency of stripe 115.

Traditionally, according to a RAID mechanism, if a writing is completed, data should be protected and data integrity should be guaranteed. However, if the writing is incomplete, there is no responsibility to repair the above inconsistency of data. That is, before the write operation is completed, the RAID mechanism cannot ensure atomicity of data. Therefore, the disk array 102 cannot ensure an integration of data on the data disk 105-4.

As shown in FIG. 1(b), in a case of inconsistency between the parity data and the valid data, if the user wants to read data in the storage area 120-2 of the failed disk 105-2, it is impossible to recover the data. Then, the user is informed of a loss of data. While the user did not touch the data on the disk 105-2 but is informed of the loss of data, this is the write hole problem. The write hole problem refers to a case that incomplete writing of unfailed disk might cause data loss in failed disk.

To avoid the above loss of data, conventionally, there is some space reserved at the end of each disk as a journal area. With the journal area, some extra operations may be performed when a write IO is implemented in a degraded mode so as to prevent the above loss of data.

Figure 2:
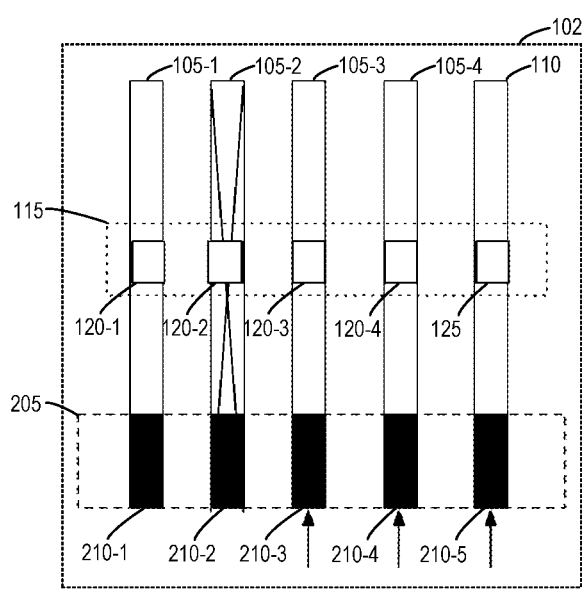
FIG. 2 illustrates a traditional arrangement of configuring a journal area in a disk array.

FIG. 2 illustrates a traditional arrangement of configuring a journal area in the disk array 102. As shown in FIG. 2, a journal area 205 is configured in the disk array 102, including journal storage areas 210-1 to 210-5 respectively located on the data disks 105-1 to 105-4 and the parity disk 110.

Different from the operations described above with reference to FIG. 1, after the above steps 1 to 3, the fourth step is not implemented immediately but instead, new valid data and parity data are written to the corresponding journal areas 210-3 to 210-5 of the data disks 105-3 and 105-4 and the parity disk 110. Then, data in the storage areas 120-3, 120-4 and 125 of data disks 105-3 and 105-4 and parity disk 110 is updated.

If the above incompletion of the write operation occurs when the data is updated, the journal is replayed after the system is recovered, thus recovering the consistency of the stripe 115. After the data updating is completed, journal storage areas 210-3 to 210-5 are invalidated. As such, there will be no risk of losing the data on the failed data disk 105-2 anymore.

However, the traditional solution as such introduces two extra disk IOs for each write IO, namely, a write journal and an invalid journal. These two extra disk IOs obviously reduce 10 performance.

The inventor finds that many computing devices or systems have battery-protected memories, also referred to as "persistent memories." After a power failure, generally, the computing device or system may be powered by a battery and continue to operate for a period of time. During this period, content of a persistent memory is stored to an internal solid state drive (SSD) card. After the system is power on again, the content will be loaded up to the memory again. Therefore, data stored in this piece of memory may be deemed as never lost. Moreover, the address of the persistent memory is usually fixed. Thus, the persistent memory may be shared by a plurality of modules as long as each module is configured with a corresponding start address.

Embodiments of the present disclosure provide a mechanism for solving the problem of write hole with a persistent memory. In a case where a disk in a disk array fails, if a request for writing data to a storage area of a stripe of the disk array is received, and it is determined if the write operation of the data is incomplete, for reasons of, for instance, power failure, whether the failed data in the stripe located in the storage area of the failed disk cannot be recovered. If there is a possibility that the data cannot be recovered, then failed data is recovered and the recovered data is stored in the persistent memory. Subsequently, based on the write data request, the data is written to the corresponding storage area of the stripe.

Compared with the traditional approach of storing new valid data and parity data in a journal area of the disk array, the way of storing recovered data in a persistent memory significantly improves (or increases) processing efficiency and performance of writing operations of the disk array with a failed disk.

Figure 3:
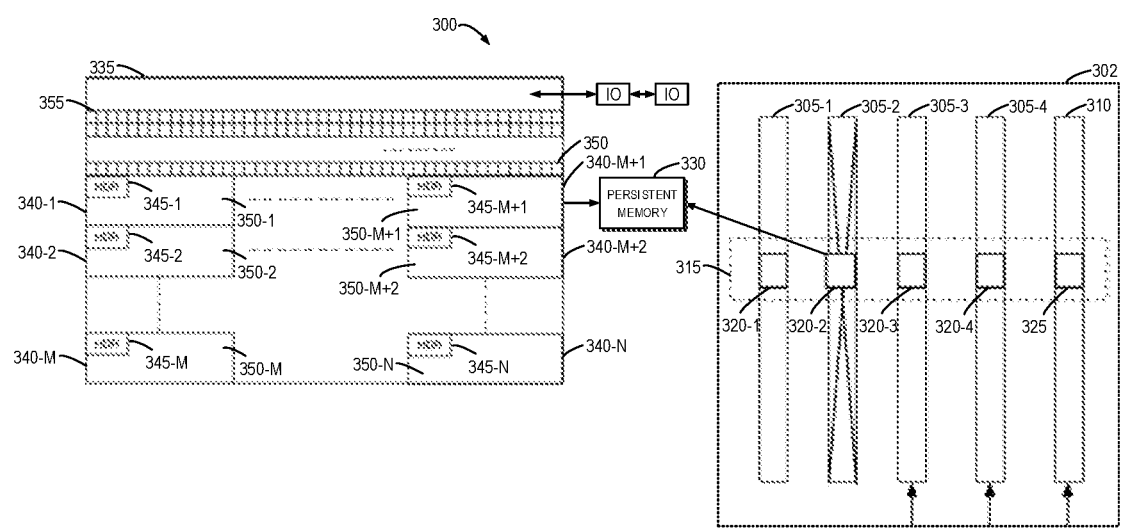
FIG. 3 illustrates an example environment in which embodiments of the present disclosure may be implemented.

FIG. 3 illustrates an example environment 300 in which embodiments of the present disclosure may be implemented. Similar to the disk array 102 shown in FIG. 1, the disk array 302 shown in FIG. 3 also includes four data disks 305-1 to 305-4 and a parity disk 310. Moreover, the stripe 315 in the disk array 300 includes four data storage areas 320-1 to 320-4 on data disks 305-1 to 305-4 and a parity storage area 325 on the parity disk 310.

It is to be understood that the disk arrangement in the disk array 300 shown in FIG. 3 is merely for the purpose of illustration with no limitation. The disk array 300 may include any proper number of data disks and parity disks. It should also be understood that merely for the purpose of illustration, only one stripe in disk array 300 is illustrated in FIG. 1. In some embodiments, any proper number of stripes may be divided across disks in the disk array 300.

In the disk array 300, a data disk 305-2 fails. It should be understood that this is only an illustrative example instead of a limitation. Any one or more disks in the disk array 300 (including data disk and parity disk) may fail.

Then, a request for writing data to the data storage areas 320-3 and 320-4 in the stripe 315, for instance, is received from a user. In response to the write request, it is determined if incomplete data write is to cause failed data in the fail data storage area 320-2 to be unrecoverable. In some embodiments, the determination may be implemented depending on whether the failed storage area is a parity storage area. If only the parity storage area 325 in the disk array 300 fails, then none of the data storage areas 320-1 to 320-4 in the disk array 300 will have the possibility that data is unrecoverable.

In some embodiments, it may be determined whether the above case that failed data is unrecoverable will occur depending on whether a write request is for the failed storage area. If the write request is for the failed data storage area 320-2, then an incomplete writing would also cause inconsistency in the stripe 315. However, as stated above, if the cache or user keeps data to be written, consistency of the stripe 315 can still be restored thereby avoiding the case that failed data is unrecoverable.

In the example shown in FIG. 3, the write request is not directed to the failed data storage area 320-2 but to the normal data storage areas 320-3 and 320-4. If the write operation to the data storage area 320-4 is incomplete due to system failure while the write operation to the data storage area 320-3 and to the parity storage area 320-4 has been completed, the case of inconsistent data versions as mentioned above will occur in stripe 315, which is to cause failed data in the failed data storage area 320-2 to be unrecoverable.

Under this condition, first, the failed data is recovered. Any proper data recovery technology currently known or to be developed in the future may be utilized. For example, the failed data in the failed data storage area 320-2 may be recovered based on parity data in the parity storage area 325 and valid data in the other normal data storage areas 320-1, 320-3 and 320-4 by means of the corresponding parity algorithm.

As shown in FIG. 3, the environment 300 may further include a persistent memory 330 for storing recovered data. In some embodiments, considering that the size of a persistent memory is generally influenced by battery capacity, the persistent memory 300 may be configured as being shared globally.

The persistent memory 330 has an organization structure 335 including a plurality of journal memories 340-1, 340-2, . . . , 340-N (collectively referred to as "journal memory block 340"). Correspondingly, a journal memory block may be selected from the plurality of journal memory blocks 340-1, 340-2, . . . , 340-N for storing recovered data.

Each journal memory block 340-1, 340-2, . . . , 340-N contains a journal header 345-1, 345-2, . . . , 345-N (collectively referred to as "a journal header 345") and a journal data area 350-1, 350-2, . . . , 350-N (collectively referred to as "a journal data area 350"). The recovered data may be stored in the journal data area 350 of the selected journal memory block 340.

The journal header 345 may store information associated with the recovered data. As an example, the journal header 345 may store an identification of the disk array 302 and an address of the recovered data in the disk array 302, such as a logic block address (LBA), the size of the recovered data and so on.

In some embodiments, the journal header 345 may further store association information between journal memory blocks 350. For example, in the embodiment where two data disks 305 in the disk array 302 fail, two journal memory blocks 340 may be selected from the plurality of journal memory blocks 340 for storing recovered data of the data storage area 320 on two failed data disks 305 respectively. The indication for indicating that the two journal memory blocks 340 are associated with each other may be stored in the corresponding journal header 345.

The structure 335 further includes a bitmap 350 associated with the plurality of journal memory blocks 340. Each bit in the bitmap 350 is used for indicating if the respective journal memory block 340 in the plurality of journal memory blocks 340 is spare. For example, "1" may be used to indicate "occupied" and "0" is used to indicate "spare."

Correspondingly, when selecting a journal memory block 340 to store recovered data, first, spare journal memory blocks are determined based on the bitmap 350. Then, the journal memory block for storing recovered data is selected from the spare journal memory blocks.

As shown in FIG. 3, the structure 335 further includes a waiting queue 355. In the absence of spare journal memory block 340, a write request for recovered data may be added to the waiting queue 355. The write request may have any proper data structure. In the embodiment of implementing a write request via a chain table, the waiting queue 355 may store a header of the corresponding chain table. After a certain journal memory block 340 is released, the write request may be woken up so that the recovered data is written to the journal memory block 340.

It is to be understood that the organization structure 335 of the persistent memory 330 shown in FIG. 3 is merely an example instead of a limitation. The persistent memory 330 may have any proper organization structure. Moreover, the recovered data may be stored in the persistent memory 300 in any proper manner.

After the recovered data is stored in the persistent memory 330, data write to the data storage area 320-4 may be performed. After this writing is completed, the recovered data stored in the persistent memory 330 may be invalidated. In this way, storage space occupied by the recovered data may be released timely thus improving utilization rate of storage resources of the persistent memory 330.

Figure 4:
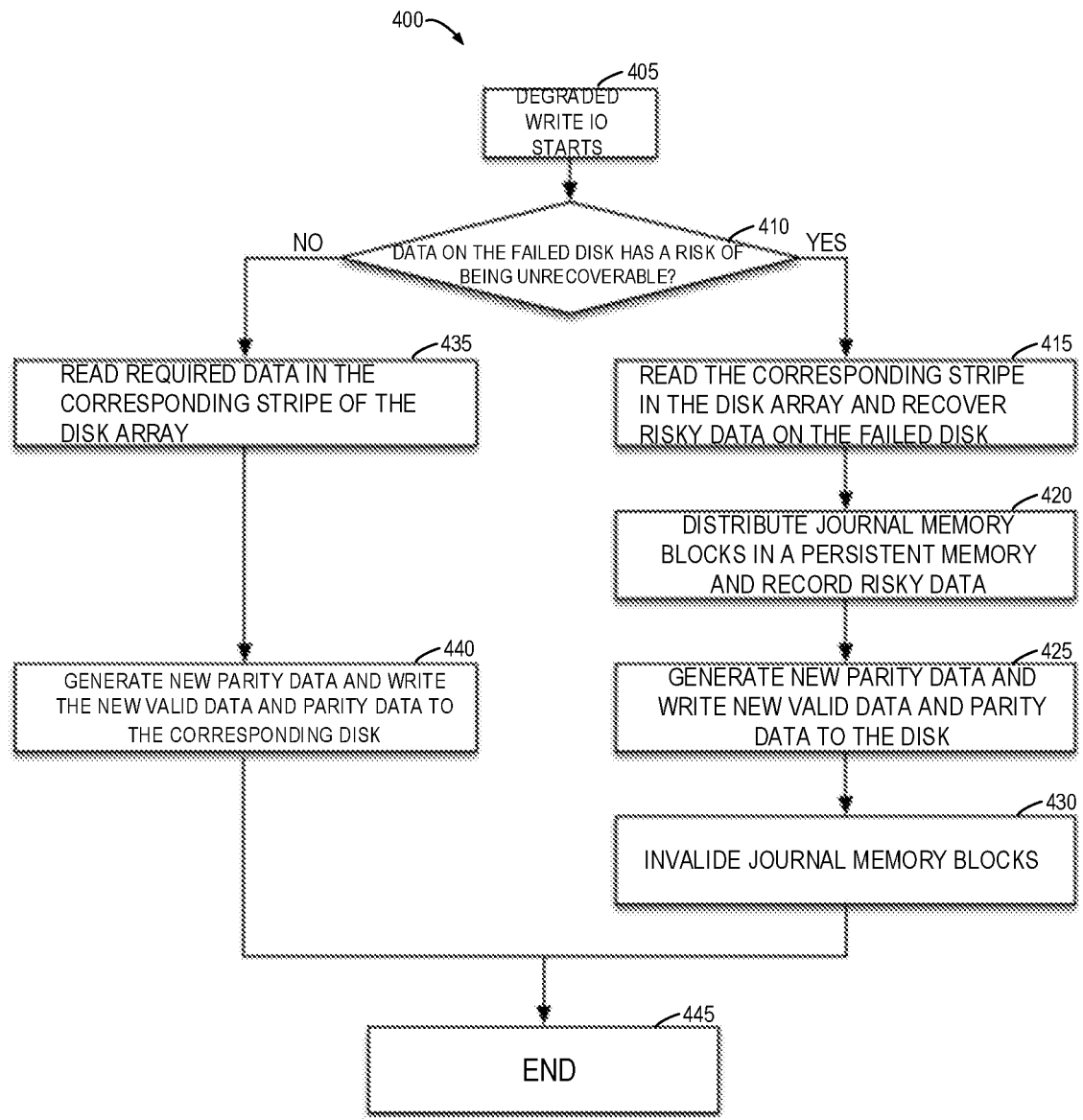
FIG. 4 is a flowchart of processing a write IO by a disk array under degraded mode according to some embodiments of the present disclosure.

FIG. 4 is a flowchart 400 of processing a write IO by a disk array under degraded mode according to some embodiments of the present disclosure. The procedure 400 may be implemented in the environment 300 shown in FIG. 3. For ease of discussion, the procedure 400 will be described below in combination with FIG. 3.

As shown in FIG. 4, at block 405, a write IO processing under degraded mode starts. At block 410, it is determined whether there is a risk that data on the storage area (for instance, the data storage area 320-2) of the failed disk (such as the data disk 305-2) is unrecoverable. If so, the procedure 400 proceeds to the block 415 where all data in the corresponding stripe (such as the stripe 315) of the disk array 302 is read and risky data on the failed disk is recovered. At block 420, the journal memory block 340 is allocated in the persistent memory 330 and the risky data is recorded. At block 425, new parity data is generated based on data to be written and the new valid data and parity data is written to the corresponding disk. At block 430, after the write is completed, the allocated journal memory block 340 is invalidated.

If it is determined at block 410 that there is no risk that the data on the failed disk is unrecoverable, the procedure 400 proceeds to block 435 where the required data is read from the corresponding stripe of the disk array 302. At block 440, new parity data is generated based on the data to be written and the new data and parity data is written to the corresponding disk. The procedure 400 ends at block 445.

According to embodiments of the present disclosure, the recovered data is stored in the persistent memory 330. Compared with the traditional manner which requires extra disk IO, processing efficiency and performance of write IO of this approach is improves significantly. Moreover, although it is necessary to read data from more disks when failed data is recovered, these read operations are performed for different disks and thus, may be processed in parallel without causing obvious performance loss.

Continuing to refer to FIG. 3. In the case of an incomplete writing caused by system failure (such as power failure) when data is written to the data storage area 320-4 of the data disk 305-4, then after the system is recovered, recovered data stored in the persistent memory 330 may be used to repair inconsistency of the stripe 315. For example, the recovered data may be read from the persistent memory 330 and parity data is generated based on the recovered data and valid data in the stripe 315. Subsequently, the parity data is stored in the parity storage area 325.

Figure 5:
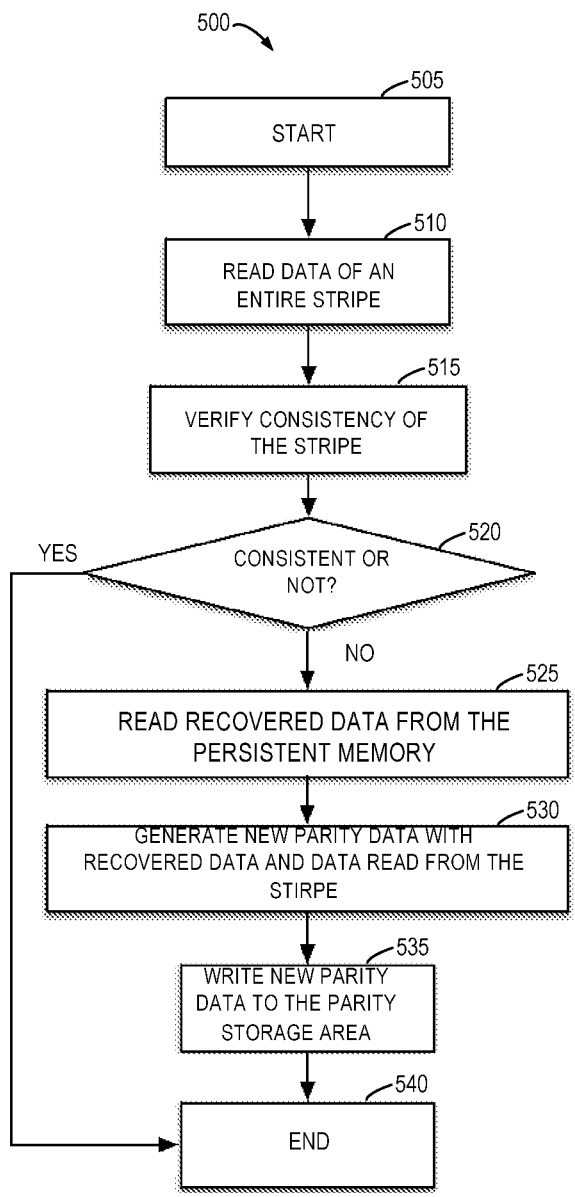
FIG. 5 is a flowchart of repairing inconsistency of a stripe of a disk array according to some embodiments of the present disclosure.

FIG. 5 shows a procedure 500 for repairing inconsistency of a stripe of a disk array according to some embodiments of the present disclosure. The procedure 500 may be implemented in the environment 300 shown in FIG. 3. For ease of discussion, the procedure 500 will be described below with reference to FIG. 3.

As shown in FIG. 5, the procedure 500 starts at block 505. At block 510, data of the entire stripe 315 is read. At block 515, consistency of stripe 315 is verified. At block 520, it is determined if the stripe 315 is consistent. If not, the procedure 500 proceeds to block 525 where recovered data is read from the persistent memory 330. At block 530, new parity data is generated with the recovered data and the data read from stripe 315. At block 535, the new parity data is written to the parity storage area 325. The procedure 500 ends at block 540. If it is determined at block 520 that the stripe 315 is consistent, the procedure 500 proceeds to block 540 that is an end.

Figure 6:
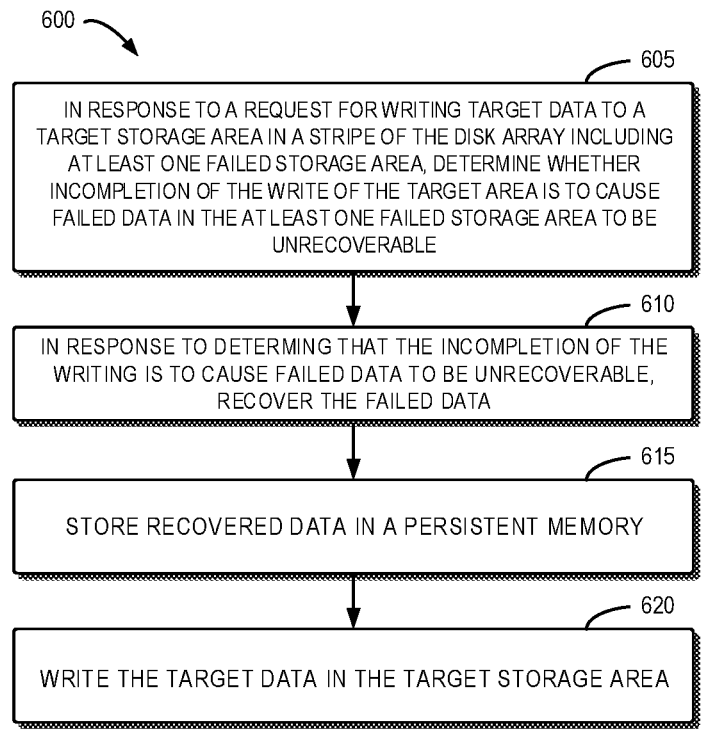
FIG. 6 is a flowchart illustrating a method according to some embodiments of the present disclosure.

FIG. 6 is a flowchart of an example method 600 according to some embodiments of the present disclosure. The method 600 may be implemented in the environment 300 shown in FIG. 3.

As shown in the figure, at block 605, in response to a request for writing target data to a target storage area in a stripe of the disk array including at least one failed storage area, it is determined whether incomplete writing of the target data is to cause failed data in the at least one failed storage area to be unrecoverable. At block 610, in response to determining that the incomplete writing is to cause failed data to be unrecoverable, the failed data is recovered. At block 615, the recovered data is stored in the persistent memory. At block 620, the target data is written in the target storage area.

In some embodiments, determining whether the incompletion of the writing is to cause the failed data to be unrecoverable includes: determining whether the target storage area is one of at least one failed storage area; and in response to determining that the target storage area is not one of at least one failed storage area, determining that the incomplete writing is to cause failed data to be unrecoverable.

In some embodiments, at least one failed storage area includes one failed storage area. Determining whether the incompletion of the writing is to cause failed data to be unrecoverable includes: determining whether the failed storage area is a parity storage area in the stripe, the parity storage area being used for storing parity data of valid data in the stripe; and in response to determining that the failed storage area is the parity storage area, determining that the incompletion of writing is not to cause the failed data to be unrecoverable.

In some embodiments, the persistent memory includes a plurality of journal memory blocks. Storing recovered data in the persistent memory includes: selecting at least one journal memory block from the plurality of journal memory blocks; and writing recovered data to the selected at least one journal memory block.

In some embodiments, the persistent memory stores a bitmap associated with a plurality of journal memory blocks, each bit in the bitmap indicating whether the respective journal memory block of the plurality of journal memory blocks is spare. Selecting the at least one journal memory block from the plurality of journal memory blocks includes: determining, based on the bitmap, whether at least one journal memory block of the plurality of journal memory blocks is spare; and in response to determining that at least one journal memory block of the plurality of journal memory blocks is spare, selecting the at least one journal memory block from the at least spare at least one journal memory block.

In some embodiments, the persistent memory further stores a waiting queue. Selecting the at least one journal memory block from the plurality of journal memory blocks further includes: in response to determining that no journal memory block of the plurality of journal memory blocks is spare, adding, to the waiting queue, a write request for recovered data.

In some embodiments, the selected at least one journal memory block includes a journal header and a journal data area. Writing recovered data to the selected at least one journal memory block includes: writing recovered data to the journal data area.

In some embodiments, writing recovered data to the selected at least one journal memory block further includes: writing, to the journal header, at least one of: an identification of the disk array, an address of the recovered data in the disk array and a size of the recovered data.

In some embodiments, at least one failed storage area includes two failed storage areas. Selecting the at least one journal memory block from the plurality of journal memory blocks includes selecting two journal memory blocks from the plurality of journal memory blocks. Writing recovered data to the selected at least one journal memory block includes: writing recovered data in the two failed storage areas to journal data areas of the selected two journal memory blocks respectively, and storing, in the journal headers of the selected two journal memory blocks, an indication for association of the selected two journal memory blocks.

In some embodiments, in response to completion of the writing of the target data, recovered data stored in the persistent memory is invalidated.

In some embodiments, in response to the incompletion of the writing of the target data, the recovered data is read from the persistent memory; based on the recovered data and valid data in the stripe, parity data is generated; and the generated parity data is stored in a parity storage area in the stripe.

It is to be understood that the operations and features described above in combination with FIGS. 3 to 5 are also applicable to the method 600, the same effect is achieved, and the specific details will not be repeated.

Figure 7:
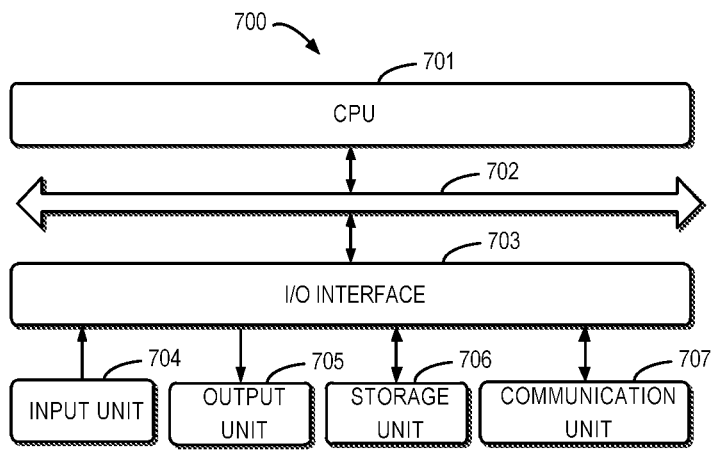
FIG. 7 is a block diagram illustrating a device suitable for implementing embodiments of the present disclosure.

FIG. 7 is a schematic block diagram of a device 700 that can be used to implement the embodiments of the present disclosure. As indicated, the device 700 includes a controller or processor, or referred to as central processing unit (CPU) 701, which can execute various appropriate actions and processing based on the computer program instructions stored in a read-only memory (ROM) 702 and/or a random access memory (RAM) 703. The ROM 702 and/or the RAM 703 also store(s) all kinds of programs and data required by operating the storage device 700. The CPU 701, ROM 702 and RAM 703 are connected to each other via a bus 704. Particularly, the device 700 may further include one or more dedicated processing units (not shown) which may also be connected to the bus 704.

An input/output (I/O) interface 705 is also connected to the bus 704. A plurality of components in the device 700 are connected to the I/O interface 705, including: an input unit 706, such as a keyboard, a mouse and the like; an output unit 707, such as various types of displays, loudspeakers and the like; a storage unit 708, such as a magnetic disk, an optical disk and the like; and a communication unit 709, such as a network card, modem, a wireless communication transceiver and the like. The communication unit 709 allows the device 700 to exchange information/data with other devices through computer networks such as Internet and/or various telecommunication networks. In particular, in the embodiments of the present disclosure, the communication unit 709 supports communication with a client or other devices.

In some embodiments, the CPU 701 may be configured to implement each procedure and processing as described above, such as the method 600. For example, in some embodiments, the method 600 can be implemented as computer software programs, which are tangibly included in a machine-readable medium, such as the storage unit 708. In some embodiments, the computer program can be partially or completely loaded and/or installed to the device 700 via the ROM 702 and/or the communication unit 709. When the computer program is loaded to the RAM 703 and executed by the controller 701, one or more steps of the above described method 600 are implemented. Alternatively, in other embodiments, the CPU 701 may also be configured to implement the above process/method in any other proper manner.

Particularly, according to the embodiments of the present disclosure, the process described above with reference to FIGS. 2-6 may be implemented as a computer program product which may be tangibly stored on a non-transient computer readable storage medium and include machine executable instructions which, when executed, cause the machine to implement various aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination thereof. More specific examples (a non-exhaustive list) of the computer readable storage medium would include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination thereof. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembly instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, by means of state information of the computer readable program instructions, an electronic circuitry including, for example, programmable logic circuitry, field-programmable gate arrays (FPGA), or programmable logic arrays (PLA)

can be personalized to execute the computer readable program instructions, thereby implementing various aspects of the present disclosure.

Aspects of the present disclosure are described herein with reference to flowchart and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

The descriptions of the various embodiments of the present disclosure have been presented for illustration purposes, but are not intended to be exhaustive or limited to the embodiments disclosed. Many modifications and variations will be apparent to those of skilled in the art without departing from the scope and spirit of the described embodiments.

We claim:

1. A method of writing to a disk array, comprising:
in response to a request for writing target data to a target storage area in a stripe of the disk array comprising at least one failed storage area, determining whether incompletion of the writing of the target data would cause failed data in the at least one failed storage area to be unrecoverable;
in response to determining that the incompletion of the writing would cause the failed data to be unrecoverable, recovering the failed data;
storing the recovered data in a persistent memory; and
writing the target data in the target storage area;
wherein the persistent memory comprises a plurality of journal memory blocks, and storing the recovered data in the persistent memory comprises:
selecting at least one journal memory block from the plurality of journal memory blocks; and
writing the recovered data to the selected at least one journal memory block; and
wherein the persistent memory stores a bitmap associated with the plurality of journal memory blocks, each bit in the bitmap indicating whether a respective journal memory block of the plurality of journal memory blocks is spare, and selecting the at least one journal memory block from the plurality of journal memory blocks comprises:
determining, based on the bitmap, whether at least one journal memory block of the plurality of journal memory blocks is spare; and
in response to determining that the at least one journal memory block of the plurality of journal memory blocks is spare, selecting the at least one journal memory block from the spare at least one journal memory block.

2. The method of claim 1, wherein determining whether the incompletion of the writing would cause the failed data to be unrecoverable comprises:
determining whether the target storage area is one of the at least one failed storage area; and
in response to determining that the target storage area is not one of the at least one failed storage area, ascertaining that the incompletion of the writing would cause the failed data to be unrecoverable.

3. The method of claim 1, wherein the at least one failed storage area comprises one failed storage area, and determining whether the incompletion of the writing would cause the failed data to be unrecoverable comprises:
determining whether the failed storage area is a parity storage area in the stripe, the parity storage area being used to store parity data of valid data in the stripe; and
in response to determining that the failed storage area is the parity storage area, ascertaining that the incompletion of the writing would not cause the failed data to be unrecoverable.

4. The method of claim 1, wherein the persistent memory further stores a waiting queue, and wherein the method further comprises:
prior to selecting the at least one journal memory block from the plurality of journal memory blocks, adding, to the waiting queue, a write request for the recovered data.

5. The method of claim 1, wherein the selected at least one journal memory block comprises a journal header and a journal data area, and writing the recovered data to the selected at least one journal memory block comprises:
writing the recovered data to the journal data area.

6. The method of claim 5, wherein writing the recovered data to the selected at least one journal memory block further comprises:
writing, to the journal header, at least one of an identification of the disk array, an address of the recovered data in the disk array, and a size of the recovered data.

7. The method of claim 5, wherein the at least one failed storage area comprises two failed storage areas;
wherein selecting the at least one journal memory block from the plurality of journal memory blocks further comprises selecting another journal memory block to select a total of two journal memory blocks from the plurality of journal memory blocks; and
wherein writing the recovered data to the selected at least one journal memory block comprises:
writing the recovered data in the two failed storage areas to journal data areas of the selected two journal memory blocks, and
storing, in journal headers of the selected two journal memory blocks, an indication for association of the selected two journal memory blocks.

8. The method of claim 1, further comprising:
in response to completion of the writing of the target data, invalidating the recovered data stored in the persistent memory.

9. The method of claim 1, further comprising:
in response to the incompletion of the writing of the target data, reading the recovered data from the persistent memory;
generating parity data based on the recovered data and valid data in the stripe; and
storing the generated parity data into a parity storage area in the stripe.

10. A device for writing to a disk array, comprising:
a processor, and
a memory storing computer executable instructions which, when executed by the processor, cause the device to perform actions comprising:
in response to a request for writing target data to a target storage area in a stripe of the disk array comprising at least one failed storage area, determining whether incompletion of the writing of the target data would cause failed data in the at least one failed storage area to be unrecoverable;
in response to determining that the incompletion of the writing would cause the failed data to be unrecoverable, recovering the failed data;

storing the recovered data in a persistent memory; and
writing the target data in the target storage area;
wherein the persistent memory comprises a plurality of journal memory blocks, and storing the recovered data in the persistent memory comprises:
selecting at least one journal memory block from the plurality of journal memory blocks; and
writing the recovered data to the selected at least one journal memory block; and
wherein the persistent memory stores a bitmap associated with the plurality of journal memory blocks, each bit in the bitmap indicating whether a respective journal memory block of the plurality of journal memory blocks is spare, and selecting the at least one journal memory block from the plurality of journal memory blocks comprises:
determining, based on the bitmap, whether at least one journal memory block of the plurality of journal memory blocks is spare; and
in response to determining that the at least one journal memory block of the plurality of journal memory blocks is spare, selecting the at least one journal memory block from the spare at least one journal memory block.

11. The device of claim 10, wherein determining whether the incompletion of the writing would cause the failed data to be unrecoverable comprises:
determining whether the target storage area is one of the at least one failed storage area; and
in response to determining that the target storage area is not one of the at least one failed storage areas, ascertaining that the incompletion of the writing would cause the failed data to be unrecoverable.

12. The device of claim 10, wherein the at least one failed storage area comprises one failed storage area, and determining whether the incompletion of the writing would cause the failed data to be unrecoverable comprises:
determining whether the failed storage area is a parity storage area in the stripe, the parity storage area being used to store parity data of valid data in the stripe; and
in response to determining that the failed storage area is the parity storage area, ascertaining that the incompletion of the writing would not cause the failed data to be unrecoverable.

13. The device of claim 10, wherein the persistent memory further stores a waiting queue, and wherein the actions further include:
prior to selecting the at least one journal memory block from the plurality of journal memory blocks, adding, to the waiting, a write request for the recovered data.

14. The device of claim 10, wherein the selected at least one journal memory block comprises a journal header and a journal data area, and writing the recovered data to the selected at least one journal memory block comprises:
writing the recovered data to the journal data area.

15. The device of claim 14, wherein writing the recovered data to the selected at least one journal memory block further comprises:
writing, to the journal header, at least one of an identification of the disk array, an address of the recovered data in the disk array, and a size of the recovered data.

16. The device of claim 14, wherein the at least one failed storage area comprises two failed storage areas;
wherein selecting the at least one journal memory block from the plurality of journal memory blocks further comprises selecting another journal memory block to select a total of two journal memory blocks from the plurality of journal memory blocks; and
wherein writing the recovered data to the selected at least one journal memory block comprises:
writing the recovered data in the two failed storage areas to journal data areas of the selected two journal memory blocks respectively, and
storing, in journal headers of the selected two journal memory blocks, an indication for association of the selected two journal memory blocks.

17. The device of claim 10, wherein the acts further comprise:
in response to completion of the writing of the target data, invalidating the recovered data stored in the persistent memory.

18. The device of claim 10, wherein the acts further comprise:
in response to the incompletion of the writing of the target data, reading the recovered data from the persistent memory;
generating parity data based on the recovered data and valid data in the stripe; and
storing the generated parity data into a parity storage area in the stripe.

19. A computer program product having a non-transitory computer readable medium which stores a set of instructions to write to a disk array; the set of instructions, when carried out by computerized circuitry, causing the computerized circuitry to perform a method of:
in response to a request for writing target data to a target storage area in a stripe of the disk array including at least one failed storage area, determining whether incompletion of the writing of the target data would cause failed data in the at least one failed storage area to be unrecoverable;
in response to determining that the incompletion of the writing would cause the failed data to be unrecoverable, recovering the failed data;
storing the recovered data in a persistent memory; and
writing the target data in the target storage area;
wherein the persistent memory comprises a plurality of journal memory blocks, and storing the recovered data in the persistent memory comprises:
selecting at least one journal memory block from the plurality of journal memory blocks; and
writing the recovered data to the selected at least one journal memory block; and
wherein the persistent memory stores a bitmap associated with the plurality of journal memory blocks, each bit in the bitmap indicating whether a respective journal memory block of the plurality of journal memory blocks is spare, and selecting the at least one journal memory block from the plurality of journal memory blocks comprises:
determining, based on the bitmap, whether at least one journal memory block of the plurality of journal memory blocks is spare; and
in response to determining that the at least one journal memory block of the plurality of journal memory blocks is spare, selecting the at least one journal memory block from the spare at least one journal memory block.

20. A method of writing to a disk array, comprising:
in response to a request for writing target data to a target storage area in a stripe of the disk array comprising at least one failed storage area, determining whether incompletion of the writing of the target data would cause failed data in the at least one failed storage area to be unrecoverable;

in response to determining that the incompletion of the writing would cause the failed data to be unrecoverable, recovering the failed data;

storing the recovered data in a persistent memory; and writing the target data in the target storage area;

wherein the persistent memory comprises a plurality of journal memory blocks, and storing the recovered data in the persistent memory comprises:

selecting at least one journal memory block from the plurality of journal memory blocks; and writing the recovered data to the selected at least one journal memory block;

wherein the selected at least one journal memory block comprises a journal header and a journal data area, and writing the recovered data to the selected at least one journal memory block comprises:

writing the recovered data to the journal data area;

wherein the at least one failed storage area comprises two failed storage areas;

wherein selecting the at least one journal memory block from the plurality of journal memory blocks comprises selecting two journal memory blocks from the plurality of journal memory blocks; and wherein writing the recovered data to the selected at least one journal memory block comprises:

writing the recovered data in the two failed storage areas to journal data areas of the selected two journal memory blocks respectively, and storing, in journal headers of the selected two journal memory blocks, an indication for association of the selected two journal memory blocks.

* * * * *